United States Patent
Daio

(10) Patent No.: US 7,375,584 B2
(45) Date of Patent: May 20, 2008

(54) GAIN ADJUSTMENT METHOD, GAIN ADJUSTMENT CIRCUIT, AND OPTICAL DISC DEVICE HAVING SAME GAIN ADJUSTMENT CIRCUIT

(75) Inventor: Katsuhisa Daio, Kagoshima (JP)

(73) Assignee: Sony Corporation (JP)

( * ) Notice: Subject to any disclaimer, the term of this patent is extended or adjusted under 35 U.S.C. 154(b) by 127 days.

(21) Appl. No.: 11/251,841

(22) Filed: Oct. 18, 2005

(65) Prior Publication Data

US 2006/0109051 A1 May 25, 2006

(30) Foreign Application Priority Data

Oct. 25, 2004 (JP) ............... P2004-309363

(51) Int. Cl.
*H03F 1/36* (2006.01)

(52) U.S. Cl. .................. 330/84; 330/86; 330/133; 330/140

(58) Field of Classification Search ............... 330/84, 330/86, 44.34, 133, 140; 369/44.34
See application file for complete search history.

(56) References Cited

U.S. PATENT DOCUMENTS

| 5,214,393 | A | * | 5/1993 | Aihara | 330/279 |
| 6,639,466 | B2 | * | 10/2003 | Johnson | 330/149 |
| 7,177,244 | B2 | * | 2/2007 | Hashimoto | 369/44.34 |

FOREIGN PATENT DOCUMENTS

JP 2002-117536 4/2002

* cited by examiner

*Primary Examiner*—Robert J. Pascal
*Assistant Examiner*—Hieu Nguyen
(74) *Attorney, Agent, or Firm*—Rader Fishman & Grauer PLLC; Ronald P. Kananen

(57) ABSTRACT

A gain adjustment circuit includes a gain varying device for varying the gain of an input signal; and a detection device for detecting a variable output signal of the gain varying device, wherein the detection output signal of the detection device is fed back to the gain varying device.

9 Claims, 5 Drawing Sheets

GAIN ADJUSTMENT METHOD, GAIN ADJUSTMENT CIRCUIT, AND OPTICAL DISC DEVICE HAVING SAME GAIN ADJUSTMENT CIRCUIT

CROSS REFERENCES TO RELATED APPLICATIONS

The present invention contains subject matter related to Japanese Patent Application JP 2004-309363 filed in the Japanese Patent Office on Oct. 25, 2004, the entire contents of which are incorporated herein by reference.

BACKGROUND OF THE INVENTION

1. Field of the Invention

The present invention relates to a gain adjustment method, a gain adjustment circuit, and an optical disc device having the gain adjustment circuit. More particularly, the present invention relates to a gain adjustment method suitable for processing a wobble signal in a disk-shaped recording medium having wobbling grooves (guide grooves), a gain adjustment circuit for use therewith, and an optical disc device having the gain adjustment circuit.

2. Description of the Related Art

In the related art, in an optical disc device for recording predetermined data on a disk-shaped recording medium having wobbling grooves or for reproducing data recorded on a disk-shaped recording medium, predetermined laser light is irradiated onto the disk-shaped recording medium, the reflected light thereof is detected to generate a wobble signal or a land prepit signal, and on the basis of a control signal, such as the wobble signal or the land prepit signal, data are recorded or data are reproduced.

In particular, the reflected light from the disk-shaped recording medium is detected using a photodetector having two optically divided portions along the tangent direction of the tracks provided on the disk-shaped recording medium.

Then, two signals output from the photodetector are each gain-adjusted by a VCA (variable gain amplifier) circuit. The two gain-adjusted signals are input to a differential device, whereby a combined signal is generated. This combined signal is input to a wobble signal detection circuit and a land prepit signal detection circuit, whereby a wobble signal and a land prepit signal are generated respectively (refer to, for example, Japanese Unexamined Patent Application Publication No. 2002-117536).

When the gain is adjusted using gain varying means such as a VCA circuit, as shown in FIG. 5, a first detection signal s110 output from a photodetector is input to a first VCA circuit 210. Also, a second detection signal s120 output from a photodetector is input to a second VCA circuit 220. The first output signal s210 and the second output signal s220, which are each gain-adjusted, are output from a first output terminal 410 and a second output terminal 420, and, in addition, these signals are input to a detection circuit 300.

In the detection circuit 300, a first control signal s310 for controlling the first VCA circuit 210 is generated and also, a second control signal s320 for controlling the second VCA circuit 220 is generated. The first control signal s310 is input to the first VCA circuit 210 and also, the second control signal s320 is input to the second VCA circuit 220, so that feedback control of the first VCA circuit 210 and the second VCA circuit 220 is performed, making it possible to output the first output signal s210 and the second output signal s220 on which desired gain adjustment is performed. In FIG. 5, reference numeral 110 denotes a first input terminal, and reference numeral 120 denotes a second input terminal.

SUMMARY OF THE INVENTION

In the above-described gain adjustment, no problem is posed when control is performed in such a manner that the absolute value of each input signal is adjusted to the reference level. However, when it is desired to perform gain adjustment while maintaining the relative levels of different input signals as in the generation of the wobble signal, the input level of the output signal of each VCA circuit, which is input to the detection circuit, does not become fixed. Moreover, there is a problem in that, because there is a case in which the sum of the output signals of each VCA circuit greatly varies, a decrease in characteristics occurs resulting from the sensitivity variations that occur in the detection circuit.

More specifically, there is the risk that because an offset of the detection circuit has a great effect on the amplitude of the output signal of each VCA circuit, which is input to the detection circuit, the balance at which the output signals of each VCA circuit are balanced varies. As a result, there is the risk that the generation accuracy of the control signal, such as a wobble signal, decreases.

According to an embodiment of the present invention, there is provided a gain adjustment circuit including: gain varying means for varying the gain of an input signal; and detection means for detecting a variable output signal of the gain varying means, wherein a detection output signal of the detection means is fed back to the gain varying means.

According to another embodiment of the present invention, there is provided a gain adjustment circuit including: first gain varying means for varying the gain of a first input signal; second gain varying means for varying the gain of a second input signal; and detection means for detecting a first variable output signal of the first gain varying means and a second variable output signal of the second gain varying means, wherein detection output signals of the detection means are fed back to the first gain varying means and the second gain varying means.

According to another embodiment of the present invention, there is provided an optical disc device including a gain adjustment circuit, wherein the gain adjustment circuit includes gain varying means for varying the gains of a plurality of different input signals; and detection means for detecting a variable output signal of the gain varying means, and the detection output signal of the detection means is fed back to the gain varying means.

Therefore, there is no risk that the sensitivity of the detection means is decreased, and it can be made difficult to receive the influence of the offset of the detection means. Thus, the detection accuracy of the detection means can be improved, and a properly adjusted signal always can be output.

There is no risk that the sensitivity of the detection means is decreased, and it can be made difficult to receive the influence of the offset of the detection means. Thus, the detection accuracy of the detection means can be improved to improve the adjustment accuracy in the gain adjustment circuit.

Desired non-linear gain amplifying means can be configured very easily, and the non-linear gain amplifying means having a high response performance during a transient response can be configured.

There is no risk that the sensitivity of the detection means is decreased, and it can be made difficult to receive the influence of the offset of the detection means. Thus, the detection accuracy of the detection means can be improved to improve the adjustment accuracy in the gain adjustment circuit, and the operation stability of the optical disc device can be improved.

DESCRIPTION OF THE PREFERRED EMBODIMENTS

In a gain adjustment method, a gain adjustment circuit, and an optical disc device having the gain adjustment circuit according to an embodiment of the present invention, gain adjustment of a plurality of different signals is performed. Each of a plurality of different signals is input to gain varying means, the output signal of the gain varying means is input to one detection section, and the gain of each signal is adjusted while performing feedback control of the gain varying means.

In particular, before each signal output from the gain varying means is input to the detection section, each signal is input to a non-linear gain amplifier section, whereby gain adjustment is performed, and the signal that is gain-adjusted by the non-linear gain amplifier section is input to the detection section.

Here, the non-linear gain amplifier section is gain amplifying means for increasing the amount of change of the output gain in an area in which the level of the output signal is comparatively low and for decreasing the amount of change of the output gain in an area in which the level of the output signal is comparatively high.

In this way, as a result of inputting a signal processed by the non-linear gain amplifier section to the detection section, even when it is desired to perform gain adjustment while maintaining the relative level of different signals, appropriate detection by the detection section is made possible without causing a decrease in the sensitivity of the detection section and, further, while suppressing the effect of the offset of the detection section.

Therefore, since the accuracy of the control signal for performing feedback control of the gain varying means, which is output from the detection section, can be improved, the gain adjustment accuracy can be improved, and the operation stability of the optical disc device having the gain adjustment circuit can be improved.

Figure 1:
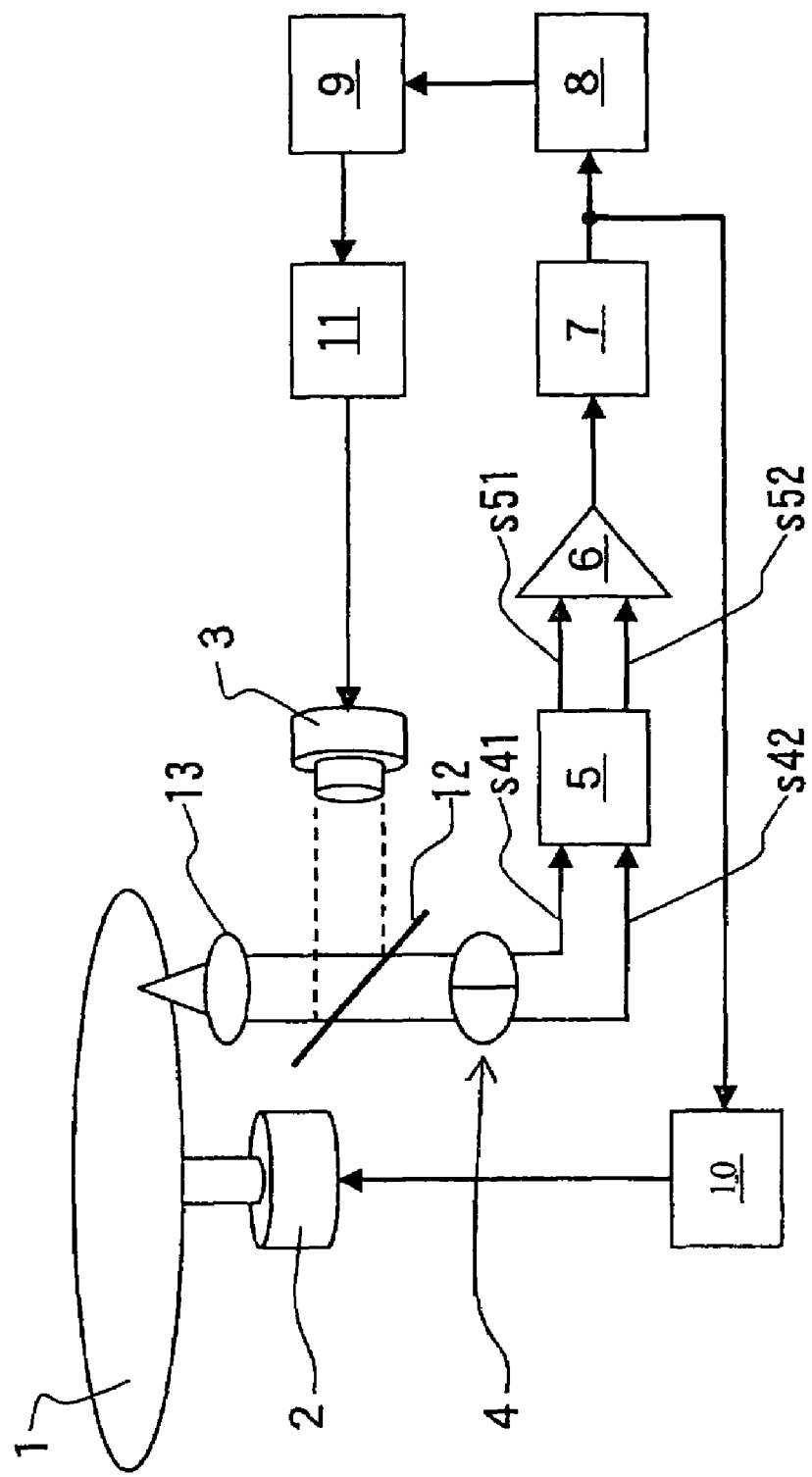
FIG. 1 is a schematic block diagram of an optical disc device according to an embodiment of the present invention.

In the following, an embodiment of the present invention will be described in more detail with reference to the drawings. FIG. 1 is a schematic block diagram of an optical disc device according to an embodiment of the present invention.

The optical disc device includes at least a spindle motor 2 for rotating a disk-shaped recording medium 1 on which predetermined data are recorded or predetermined data are to be recorded; a laser 3 for irradiating laser light onto the disk-shaped recording medium 1 that is rotationally driven by the spindle motor 2; a photodetector 4 having two portions for detecting the laser light irradiated from the laser 3 then reflected from the disk-shaped recording medium 1; a gain adjustment circuit 5 for performing gain adjustment of a first detection signal and a second detection signal output from the photodetector 4; a differential device 6 for generating a combined signal of the signals that are gain-adjusted by the gain adjustment circuit 5; a wobble detection circuit 7 for generating a wobble signal from the combined signal generated by the differential device 6; an address detection circuit 8 for generating an address data signal on the basis of the wobble signal generated by the wobble detection circuit 7; and a central processing unit (CPU) 9 to which the address data signal generated by the address detection circuit 8 is input.

The spindle motor 2 is controlled by a spindle driver circuit 10 for generating a spindle motor control signal on the basis of the wobble signal.

The laser 3 irradiates laser light on the basis of a laser control signal output from a laser control circuit 11. A laser output control signal output from the CPU 9 is input to the laser control circuit 11, making it possible to generate a desired laser control signal. In FIG. 1, reference numeral 12 denotes a half mirror for changing the irradiation direction of the laser light irradiated from the laser 3, and reference numeral 13 denotes a converging lens for converging laser light into a spot.

Figure 2:
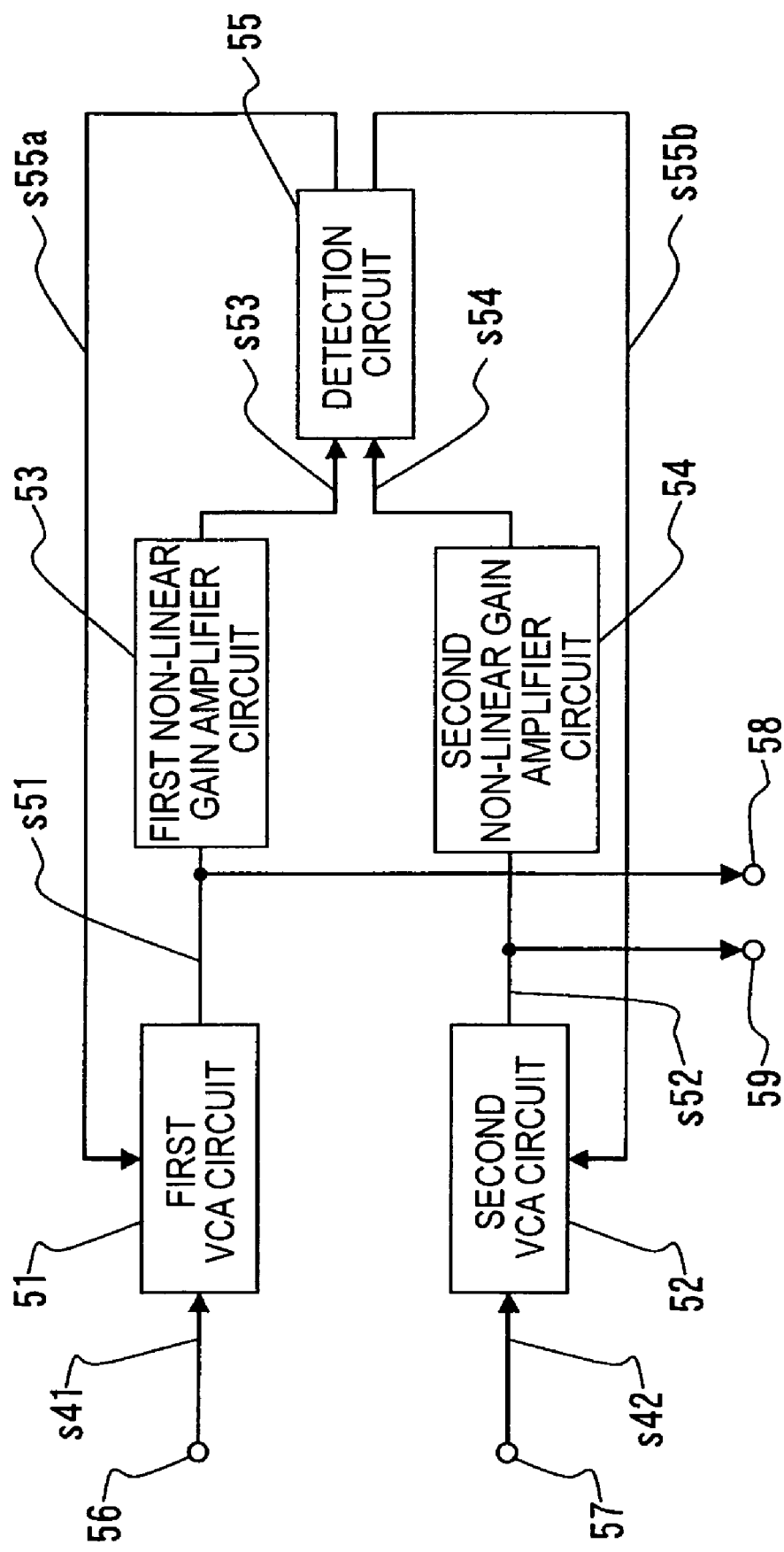
FIG. 2 is a schematic block diagram of a gain adjustment circuit according to an embodiment of the present invention.

The gain adjustment circuit 5, as shown in FIG. 2, is provided with; a first VCA circuit 51 to which a first detection signal s41 output from the photodetector 4 is input; a second VCA circuit 52 to which a second detection signal s42 output from the photodetector 4 is input; a first non-linear gain amplifier circuit (hereinafter, referred to as a "first NLGA circuit") 53 for performing further gain adjustment of the first output signal s51 that is gain-adjusted in the first VCA circuit 51; and a second non-linear gain amplifier circuit (hereinafter, referred to as a "the second NLGA circuit") 54 for performing further gain adjustment of the second output signal s52 that is gain-adjusted in the second VCA circuit 52.

Furthermore, the gain adjustment circuit 5 is provided with a detection circuit 55 for generating a first control signal s55a for performing feedback control of the first VCA circuit 51 by using a first intermediate signal s53 output from the first NLGA circuit 53 and a second intermediate signal s54 output from the second NLGA circuit 54, and a second control signal s55b for performing feedback control of the second VCA circuit 52. In FIG. 2, reference numeral 56 denotes a first input terminal, reference numeral 57 denotes a second input terminal, reference numeral 58 denotes a first output terminal, and reference numeral 59 denotes a second output terminal.

The first VCA circuit 51 and the second VCA circuit 52 each include an AGC (Automatic Gain Control) circuit so as to make it possible to adjust a gain. The first control signal s55a is input to the first VCA circuit 51 in order to perform feedback control of the first VCA circuit 51 so that desired gain adjustment is performed. Also, the second control signal s55b is input to the second VCA circuit 52 in order to perform feedback control of the second VCA circuit 52 so that desired gain adjustment is performed.

Figure 3:
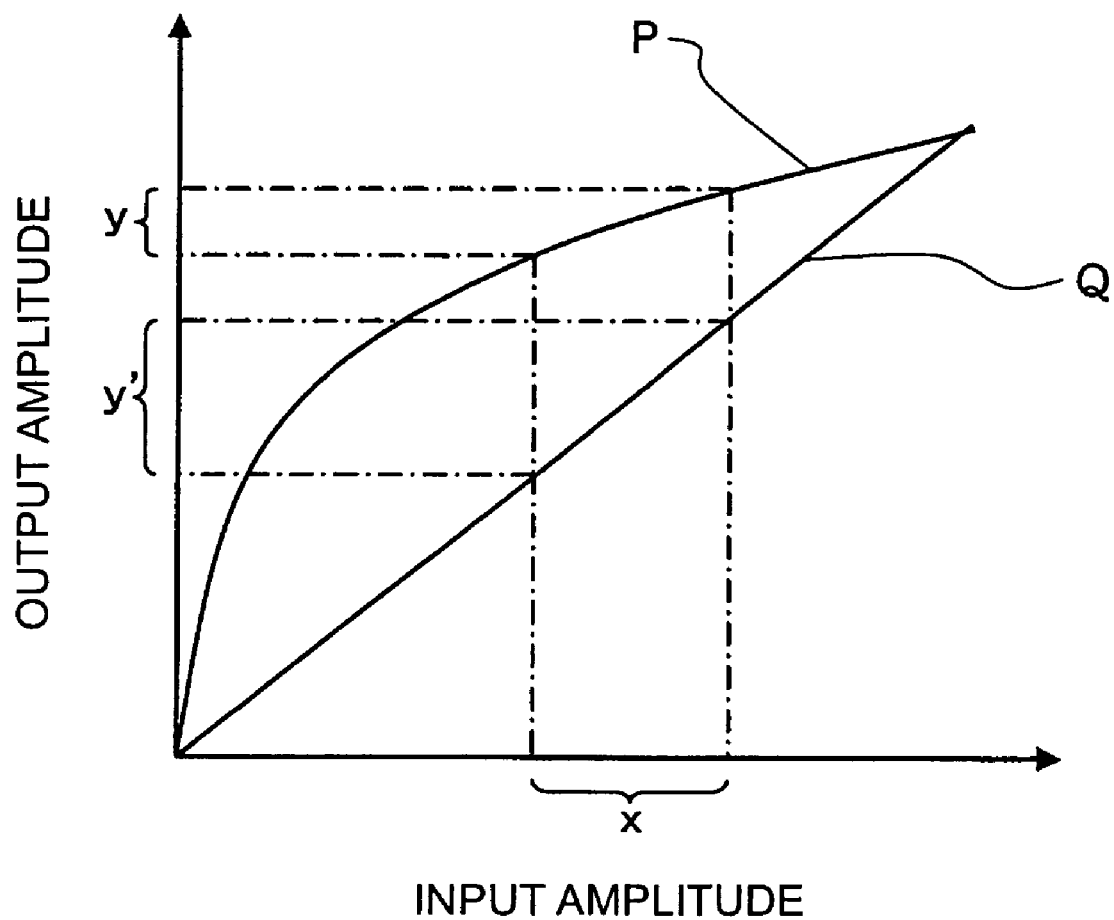
FIG. 3 is a characteristic curve diagram of a non-linear gain amplifier circuit used in the gain adjustment circuit according to an embodiment of the present invention.

As shown by a curve P in the characteristic curve diagram of FIG. 3, the first NLGA circuit 53 and the second NLGA circuit 54 have characteristics such that the amount of change of the output gain is increased in an area in which the levels of the first output signal s51 and the second output signal s52 are comparatively low and the amount of change of the output gain is decreased in an area in which the levels of the output signals are comparatively high. A straight line Q in the characteristic curve diagram of FIG. 3 indicates a characteristic curve of a typical gain amplifier.

Therefore, in the first NLGA circuit 53 and the second NLGA circuit 54, the absolute value of the output amplitude can be increased while decreasing the amount of change (area y in FIG. 3) of the output amplitude with respect to the amount of change (area x in FIG. 3) of a predetermined input amplitude to less than the amount of change with respect to the amount of change (area y' in FIG. 3) of the output amplitude in the gain amplifier of the related art.

As a result of providing such a first NLGA circuit 53 and such a second NLGA circuit 54 at a stage prior to the detection circuit 55, an output can be made sufficiently large with respect to an input, and even if the input amplitude varies, the output amplitude input to the detection circuit 55 can be sufficiently reduced. Thus, variations in the detection sensitivity of the detection circuit 55 can be suppressed.

Furthermore, by configuring the first NLGA circuit 53 and the second NLGA circuit 54 to be identical to each other, the influence of absolute variations of the signal input to the detection circuit 55 can be eliminated.

Figure 4:
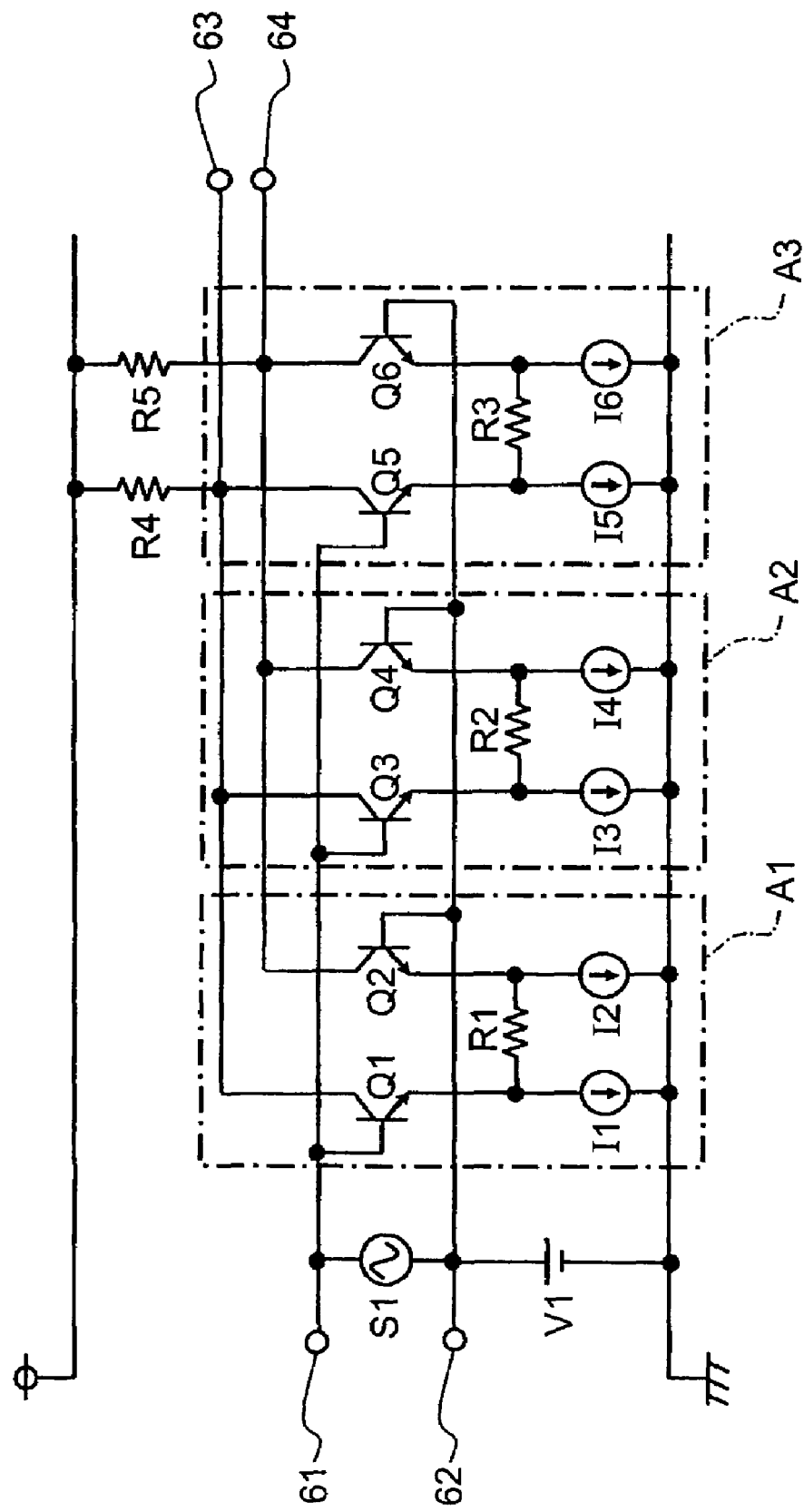
FIG. 4 is a circuit diagram of the non-linear gain amplifier circuit according to an embodiment of the present invention.
Figure 5:
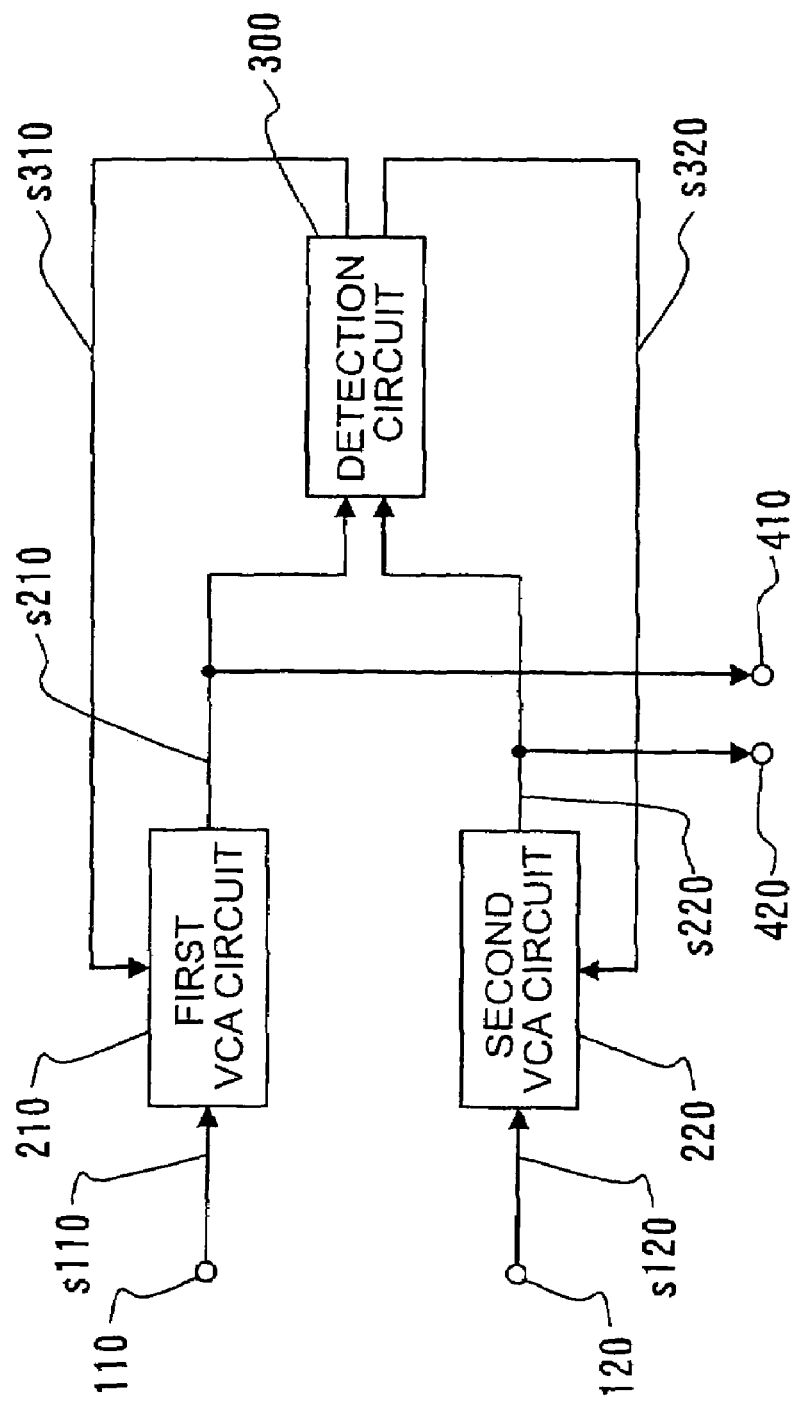
FIG. 5 is a block diagram of a gain adjustment circuit of the related art.

In this embodiment, for the first NLGA circuit 53 and the second NLGA circuit 54, the non-linear gain amplifier circuit shown in FIG. 4 is used.

The non-linear gain amplifier circuit shown in FIG. 4 is configured in such a manner that a DC power-supply is connected to each emitter and a plurality of differential amplifier circuits formed by a set of two transistors, the section between the emitters of the transistors being connected via a resistor, is connected in parallel. Here, three differential amplifier circuits A1, A2, and A3, that is, a first differential amplifier circuit A1, a second differential amplifier circuit A2, and a third differential amplifier circuit A3, are connected in parallel to one another. In this embodiment, although the three differential amplifier circuits A1, A2, and A3 are provided, a larger number of differential amplifier circuits may be connected in parallel with one another.

In each of the differential amplifier circuits A1, A2, and A3, the resistance values of the resistors R1, R2, and R3 that connect the emitters of the two transistors are set differently from one another, causing the dynamic ranges of the differential amplifier circuits A1, A2, and A3 to differ from one another. As a result of connecting in parallel the differential amplifier circuits A1, A2, and A3 whose dynamic ranges differ from one another, the characteristic curve shown in FIG. 3 is obtained.

The dynamic ranges of the differential amplifier circuits A1, A2, and A3 can be made different from one another by not only changing the resistance values of the resistors R1, R2, and R3 that connect the emitters of two transistors, but also by making the electrical current values of the DC power-supplies connected to the transistors of the differential amplifier circuits A1, A2, and A3 differ from one another while the resistors R1, R2, and R3 are set to have the same resistance value.

In this embodiment, $R1 \neq R2$, $R2 \neq R3$, $R3 \neq R1$, $R4=R5$, and $I1=I2$, $I3=I4$, $I5=I6$, and $I1 \approx I3 \approx I5$. In FIG. 4, reference numeral 61 denotes an input terminal, reference numeral 62 denotes a bias connection terminal on the input side, reference numeral 63 denotes an output terminal, and reference numeral 64 denotes a bias connection terminal on the output side.

In this way, as a result of configuring a non-linear gain amplifier circuit by connecting in parallel a plurality of amplifier circuits having different dynamic ranges, a non-linear gain amplifier circuit having a desired characteristic curve can be configured very easily, and also, a non-linear gain amplifier circuit having a high response performance during a transient response can be configured.

Although this embodiment describes a case in which the gain adjustment circuit is used to generate a wobble signal in the manner described above, in addition, the gain adjustment circuit according to the embodiment of the present invention can be used not only to generate a wobble signal, but also to perform gain adjustment of a plurality of different signals.

It should be understood by those skilled in the art that various modifications, combinations, subcombinations and alterations may occur depending on design requirements and other factors insofar as they are within the scope of the appended claims or the equivalents thereof.

What is claimed is:

1. A gain adjustment circuit comprising:
    a gain varying section varying the gain of an input signal; and
    a detection section detecting a variable output signal of the gain varying section,
    wherein a detection output signal of the detection section is fed back to the gain varying section, and
    wherein a non-linear gain amplifying section performing non-linear amplification of the variable output signal is connected at a stage prior to the detection section and
    wherein the non-linear gain amplifying section is configured in such a way that a plurality of amplifier circuits having different dynamic ranges are connected in parallel.

2. The gain adjustment circuit according to claim 1, wherein the non-linear gain amplifying section increases the amount of change of the gain of the variable output signal in an area where the level of the variable output signal is comparatively low and decreases the amount of change of the gain of the variable output signal in an area where the level of the variable output signal is comparatively high.

3. The gain adjustment circuit as set forth in claim 1 wherein the variable output signal is connected at an output terminal.

4. A gain adjustment circuit comprising:
    a first gain varying section varying the gain of a first input signal;
    a second gain varying section varying the gain of a second input signal; and
    a detection section detecting a first variable output signal of the first gain varying section and a second variable output signal of the second gain varying section,
    wherein detection output signals of the detection section are fed back to the first gain varying section and the second gain varying section, and
    wherein a non-linear gain amplifying section performing non-linear amplification of the variable output signal is connected at a stage prior to the detection section.

5. The gain adjustment circuit according to claim 4, wherein a non-linear gain amplifying section increases the amount of change of the gain of the variable output signal in an area where the level of the variable output signal is comparatively low and decreases the amount of change of the gain of the variable output signal in an area where the level of the variable output signal is comparatively high.

6. The gain adjustment circuit according to one of claims 4 and 5, wherein the non-linear gain amplifying section is configured in such a way that a plurality of amplifier circuits having different dynamic ranges are connected in parallel.

7. An optical disc device comprising:
a gain adjustment circuit,
wherein the gain adjustment circuit includes
a gain varying section varying the gains of a plurality of different input signals; and
a detection section detecting a variable output signal of the gain varying section, and
the detection output signal of the detection section is fed back to the gain varying section, wherein a non-linear gain amplifying section performing non-linear amplification of the variable output signal is connected at a stage prior to the detection section.

8. The optical disc device according to claim 7, wherein the non-linear gain amplifying section increases the amount of change of the gain of the variable output signal in an area where the level of the variable output signal is comparatively low and decreases the amount of change of the gain of the variable output signal in an area where the level of the variable output signal is comparatively high.

9. The optical disc device according to one of claims 7 and 8, wherein the non-linear gain amplifying section is configured in such a way that a plurality of amplifier circuits having different dynamic ranges are connected in parallel.

* * * * *